US008168377B2

(12) United States Patent
Mitsuoka et al.

(10) Patent No.: US 8,168,377 B2
(45) Date of Patent: May 1, 2012

(54) PATTERN FORMING METHOD AND METHOD OF MANUFACTURING SEMICONDUCTOR DEVICE BY USING THE SAME

(75) Inventors: Kazuyuki Mitsuoka, Nirasaki (JP); Makoto Muramatsu, Nirasaki (JP); Mitsuaki Iwashita, Nirasaki (JP)

(73) Assignee: Tokyo Electron Limited (JP)

( * ) Notice: Subject to any disclaimer, the term of this patent is extended or adjusted under 35 U.S.C. 154(b) by 575 days.

(21) Appl. No.: 12/391,679

(22) Filed: Feb. 24, 2009

(65) Prior Publication Data

US 2009/0220898 A1 Sep. 3, 2009

(30) Foreign Application Priority Data

Feb. 28, 2008 (JP) ................................. 2008-048611

(51) Int. Cl.
*G03F 7/11* (2006.01)
*G03F 7/16* (2006.01)
*G03F 7/38* (2006.01)
*G03F 7/40* (2006.01)
*B05D 3/10* (2006.01)
*B06D 5/12* (2006.01)
*H01L 21/308* (2006.01)

(52) U.S. Cl. ......... 430/325; 430/322; 430/326; 427/333
(58) Field of Classification Search .................. 430/325, 430/326, 322; 427/333
See application file for complete search history.

(56) References Cited

U.S. PATENT DOCUMENTS

| 5,858,620 | A | * | 1/1999 | Ishibashi et al. | ............... | 430/313 |
| 6,319,853 | B1 | * | 11/2001 | Ishibashi et al. | ............... | 438/780 |
| 7,662,539 | B2 | * | 2/2010 | Nozaki et al. | ............... | 430/273.1 |
| 2004/0110099 | A1 | * | 6/2004 | Kozawa et al. | ............... | 430/325 |
| 2005/0031987 | A1 | * | 2/2005 | Nozaki et al. | ............... | 430/270.1 |

FOREIGN PATENT DOCUMENTS

| JP | 10-073927 | 3/1998 |
| JP | 11-204339 | 7/1999 |
| JP | 2004-191465 | 7/2004 |
| JP | 2005-055873 | 3/2005 |

OTHER PUBLICATIONS

Japanese Office Action-Issued No. 676922 dated Nov. 10, 2009.
Notice of Grounds of Rejection-Korean Application No. 10-2008-0134351 issued Oct. 21, 2010, citing JP2005-55873 and JP11-204399.

* cited by examiner

*Primary Examiner* — Shean Wu
(74) *Attorney, Agent, or Firm* — Cantor Colburn LLP

(57) ABSTRACT

The pattern forming method includes forming a catalyst film on a base layer having an uneven surface, wherein the catalyst layer is formed along the uneven surface of the base layer; forming a coating film by coating a fluid material on the catalyst film; forming an insoluble layer which is insoluble in a solvent in the coating film by reacting the coating film along the catalyst film; and maintaining the insoluble layer by removing an unreacted portion of the coating film by using the solvent.

19 Claims, 27 Drawing Sheets

FIG. 4

|   | Catalysts | Fluid materials |
|---|---|---|
| 1 | Basic catalyst | SOG |
| 2 | Basic catalyst | Chemical-amplification positive resist |
| 3 | Basic catalyst | MSQ-based SOD |
| 4 | Basic catalyst | Material containing melamine resin, urea resin, epoxy resin, or urethane resin |
| 5 | Acid catalyst | Chemical-amplification negative resist |
| 6 | Metallic catalyst | Material containing melamine resin |

PATTERN FORMING METHOD AND METHOD OF MANUFACTURING SEMICONDUCTOR DEVICE BY USING THE SAME

CROSS-REFERENCE TO RELATED PATENT APPLICATION

This application claims the benefit of Japanese Patent Application No. 2008-048611, filed on Feb. 28, 2008, in the Japanese Intellectual Property Office, the disclosure of which is incorporated herein in their entirety by reference.

BACKGROUND OF THE INVENTION

1. Field of the Invention

The present invention relates to a pattern forming method which is used in a semiconductor process, and a method of manufacturing a semiconductor device by using the same.

2. Description of the Related Art

A coating method and a deposition method such as a chemical vapor deposition (CVD) method or a physical vapor deposition (PVD) method are generally used as thin film forming methods in semiconductor manufacturing fields. The coating method is advantageous to make a finely uneven surface flat by coating a thin film material solution on a surface of a substrate and, and then drying and curing the thin film material solution. The deposition method is advantageous to form a film while maintaining an uneven surface of a substrate by growing a thin film from the surface of the substrate.

A method of forming a fine pattern by using a coating method is disclosed in:

Japanese Patent Publication No. 2004-191465 (Reference 1); and

Japanese Patent Publication No. 1998-073927 (Reference 2).

Reference 1 discloses a method of forming a fine resist removal pattern which has exceeded an exposure limit. A resist pattern is formed by coating a resist by using a coating method and developing the coated resist by using an exposure method. Also, a surfactant layer is formed on a surface of the resist pattern by coating a surfactant on the developed resist pattern. Furthermore, a mixing layer is formed on the surface of the resist pattern on which the surfactant layer is formed by coating a resist pattern thickening material on the resist pattern and then integrating the resist pattern thickening material to the resist pattern through the surfactant layer, thereby thickening the resist pattern (see Paragraph [0091] of Reference 1). A fine resist pattern which has exceeded an exposure limit is formed by removing a portion of the resist pattern thickening material which is not formed into the mixing layer.

Similarly to Reference 1, Reference 2 discloses a method of forming a fine resist pattern which has exceeded an exposure limit. A resist pattern containing an acid generating material that generates an acid by exposure is formed by coating a resist containing the acid generating material by using a coating method and developing the coated resist by using an exposure method. Also, a resist containing a cross-linking material that performs a cross-linking function due to an acid is coated on the resist pattern, acid is generated on the resist pattern by heating or exposing the resist pattern, and the resist pattern is covered with a cross-linking layer formed on an interface, thereby thickening the resist pattern. A fine resist pattern which has exceeded an exposure limit is formed by removing a portion of the resist containing the cross-linking material which is not formed into the cross-linking layer.

References 1 and 2 provide a fine resist pattern which has exceeded an exposure limit. For this, a resist pattern is required to be thickened. However, References 1 and 2 do not reduce a cost for forming a thin film or realize a high throughput.

A coating method has a lower cost and a higher throughput than a deposition method. However, differently from the deposition method, a conformal film in which an uneven surface of a substrate is maintained cannot be formed when an ordinary coating method is used. Since a material used to form a film is fluid, concavities of the substrate are filled with priority and convexities of the substrate are not covered with the film until the surface of the substrate becomes flat.

SUMMARY OF THE INVENTION

The present invention provides a pattern forming method of forming a conformal film, in which an uneven surface of a substrate is maintained, by a coating method, and a method of manufacturing a semiconductor device by using the same.

According to an aspect of the present invention, there is provided a pattern forming method including forming a catalyst film on a base layer having an uneven surface, wherein the catalyst film is formed along the uneven surface of the base layer; forming a coating film by coating a fluid material on the catalyst film; forming an insoluble layer which is insoluble in a solvent in the coating film by reacting the coating film along the catalyst film; and maintaining the insoluble layer by removing an unreacted portion of the coating film by using the solvent.

According to another aspect of the present invention, there is provided a method of manufacturing a semiconductor device, the method including forming an insoluble layer conforming to a sacrificial film pattern, which forms an uneven surface on a base layer, by using the above pattern forming method; exposing a top portion of the sacrificial film pattern by etching the insoluble layer; maintaining the insoluble layer while removing exposed top portion of the sacrificial film pattern; and etching the base layer by using the insoluble layer as a mask to form the base layer into a predetermined pattern.

BRIEF DESCRIPTION OF THE DRAWINGS

The above and other features and advantages of the present invention will become more apparent by describing in detail exemplary embodiment of the present inventions thereof with reference to the attached drawings in which:

FIG. 4 is a table showing combination examples between a catalyst and a fluid material, according to a second embodiment of the present invention;

DETAILED DESCRIPTION OF THE INVENTION

Hereinafter, the present invention will be described in detail by explaining embodiments of the present invention with reference to the attached drawings.

(First Embodiment)

FIGS. 1A through 1I are cross-sectional views for describing a pattern forming method according to an example of a first embodiment of the present invention. In the current example of the first embodiment of the present invention, a conformal film is formed on a concave substrate.

Figure 1A:
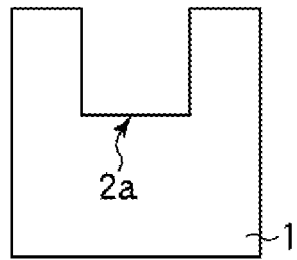
FIGS. 1A through 1I are cross-sectional views for describing a pattern forming method according to an example of a first embodiment of the present invention.
Figure 1B:
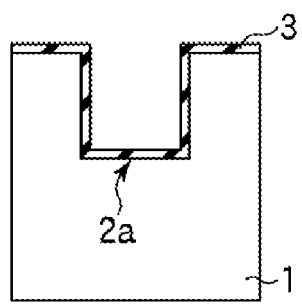
Figure 1C:
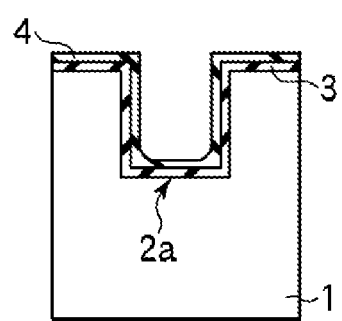
Figure 1D:
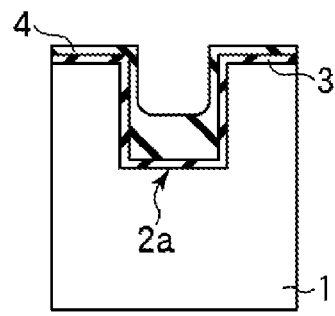
Figure 1E:
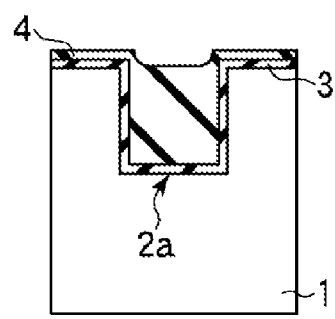
Figure 1F:
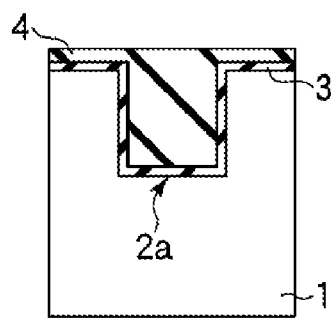
Figure 1G:
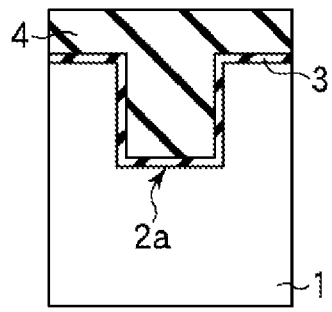

Initially, a substrate 1 having concavities 2a is prepared (FIG. 1A). For example, the substrate 1 may be a silicon substrate. Then, a catalyst film 3 is formed on the substrate 1 (FIG. 1B). For example, the catalyst film 3 may be formed of a basic catalyst. An amino-based coupling agent (amino-based silylation agent) is used as the basic catalyst in the current example of the first embodiment of the present invention. An amino-based coupling agent on the market, such as KBM603 by Shin-Etsu Chemical Co., Ltd. (Japan), may be used. In addition, any amino-based coupling agent may be used to form the catalyst film 3. Alternatively, a coupling agent having a basic functional group may be used.

In the present invention, a "catalyst" may contain a material that does not take part in a reaction and triggers another material to react, a material that takes part in a reaction and triggers another material to react, or a material that inhibits reaction of another material. The catalyst film 3 may be formed on the substrate 1 having the concavities 2a as a conformal film. For this, a material used to form the catalyst film 3 may be attached on the substrate 1 having the concavities 2a by using, for example, a chemical vapor deposition (CVD) method, a gas absorption method, or a coating method. For example, the amino-based coupling agent may be attached on the substrate 1 having the concavities 2a by using the coating method, and more particularly, a spin-coating method.

If the catalyst film 3 is formed by using the CVD method, a deposition method is used. However, the catalyst film 3 is a film for making a subsequent film insoluble in a solvent. The catalyst film 3 may have a small thickness of, for example, about 1 nm or less. Thus, although the deposition method is used, fabrication cost is not greatly increased and a throughput is not greatly decreased.

Then, a coating film 4 is formed by coating a fluid material on the catalyst film 3 as illustrated in FIGS. 1C through 1G. For example, the spin-coating method may be used. The fluid material fills the concavities 2a with priority as sequentially illustrated in FIGS. 1C through 1G. As such, a conformal film in which an uneven surface (the concavities 2a) of the substrate 1 is maintained cannot be formed by using a coating method using a fluid material. A spin on glass (SOG) is used as the fluid material in the current example of the first embodiment of the present invention. In particular, an SOG in which silanol condensation is promoted due to the amino-based coupling agent is used as the fluid material in the current example of the first embodiment of the present invention. Any SOG on the market such as OCD T-12 by Tokyo Ohka Kogyo Co., Ltd. may be used. In addition, any SOG in which silanol condensation occurs due to the amino-based coupling agent may be used as the fluid material.

Figure 1H:
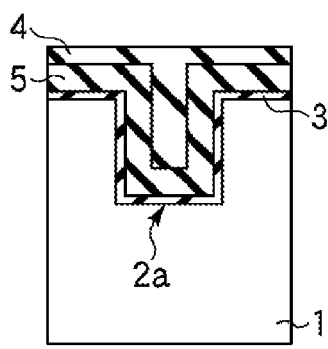

Then, an insoluble layer 5 that is insoluble in the solvent is formed in the coating film 4 by reacting the coating film 4 along the catalyst film 3 (FIG. 1H). In the present invention, the term "insoluble" also includes the term "hardly soluble", in which case solubility with respect to the solvent is less than the solubility of an unreacted portion. In the current example of the first embodiment of the present invention, "reaction" is "silylation" because the catalyst film 3 is formed of the amino-based coupling agent and the coating film 4 is formed of the SOG in which silanol condensation occurs due to the amino-based coupling agent. A silylated portion of the coating film 4 becomes the insoluble layer 5 that is insoluble in the solvent. The solvent may be a material such as isopropyl alcohol (IPA), which does not dissolve the silylated portion of the coating film 4 and dissolves the unreacted portion that is not silylated. Since the insoluble layer 5 is formed along the catalyst film 3, the insoluble layer 5 is formed in a conformal shape in which an uneven surface (the concavities 2a) of the substrate 1 is maintained. Also, this reaction occurs while the coated fluid material is spin-dried.

Figure 1I:
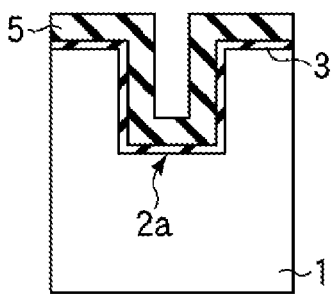

Then, the unreacted portion of the coating film 4 is removed by using the solvent, thereby only the insoluble layer 5 remaining (FIG. 1I). As such, the insoluble layer 5 may be formed as a conformal film in which an uneven surface (the concavities 2a) of the substrate 1 is maintained. The coating film 4 that functions as a base of the insoluble layer 5 is formed of the SOG and is formed by using a coating method using a fluid material, instead of a deposition method. The coating method has a lower cost and a higher throughput than the deposition method.

Thus, according to the current example of the first embodiment of the present invention, a pattern may be formed with a lower cost and a higher throughput than a deposition method by forming a conformal film in which an uneven surface of a substrate is maintained.

A pattern forming method with a low cost and a high throughput is useful for a manufacturing process in areas where cost reduction or turn around time reduction is highly demanded, e.g., a manufacturing process for a semiconductor device or a flat panel display (FPD) device.

Although the current example of the first embodiment of the present invention is described with respect to a substrate having concavities, the pattern forming method may also applied to a substrate having convexities, which will now be described in detail with reference to FIGS. 2A through 2I.

FIGS. 2A through 2I are cross-sectional views for describing a pattern forming method according to another example of the first embodiment of the present invention.

Figure 2A:
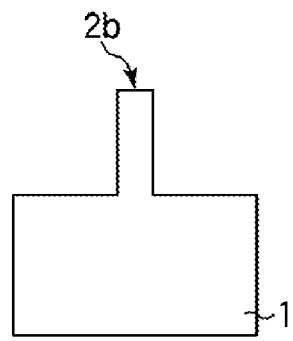
FIGS. 2A through 2I are cross-sectional views for describing a pattern forming method according to another example of the first embodiment of the present invention.
Figure 2B:
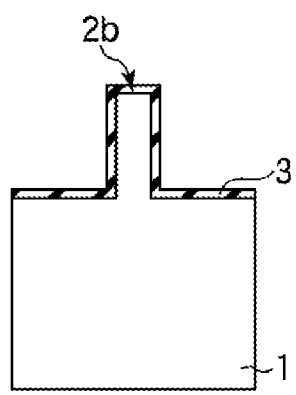
Figure 2C:
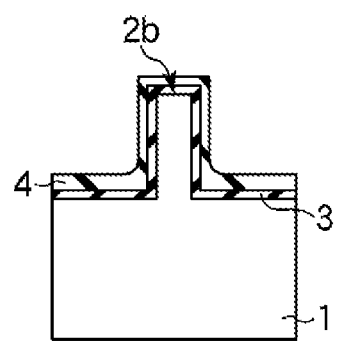
Figure 2D:
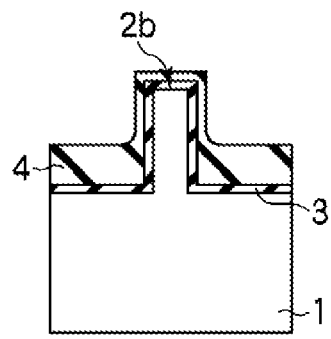
Figure 2E:
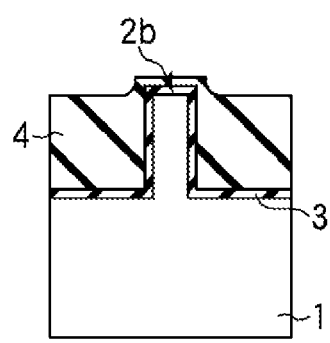
Figure 2F:
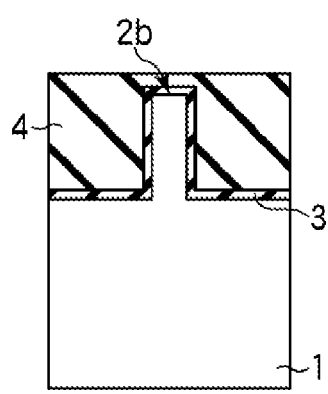
Figure 2G:
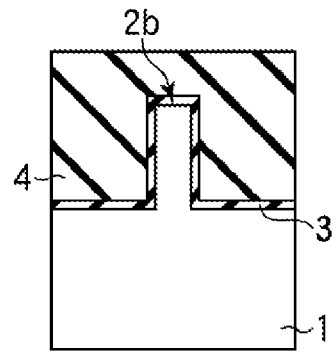

Initially, a substrate 1 having convexities 2b is prepared (FIG. 2A). For example, the substrate 1 may be a silicon substrate as in FIG. 1A. Then, a catalyst film 3 is formed on the substrate 1 (FIG. 2B). For example, the catalyst film 3 may be formed of an amino-based coupling agent and may be formed by using a coating method, as in FIG. 1B.

Then, a coating film 4 is formed by coating a fluid material on the catalyst film 3 as illustrated in FIGS. 2C through 2G. The fluid material is not formed on the convexities 2b until portions around the convexities 2b are completely and evenly filled, as sequentially illustrated in FIGS. 2C through 2G. As such, a coating method using a fluid material cannot form a conformal film in which an uneven surface (the convexities 2b) of the substrate 1 is maintained. For example, an SOG in which silanol condensation occurs due to the amino-based coupling agent may be used as the fluid material, as described with reference to FIGS. 1C through 1G.

Figure 2H:
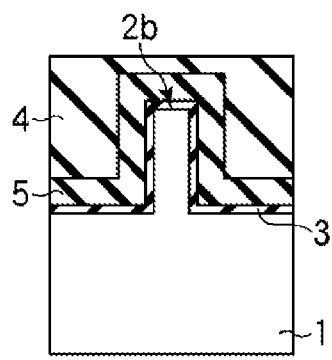

Then, an insoluble layer 5 that is insoluble in a solvent is formed in the coating film 4 by reacting the coating film 4 along the catalyst film 3 (FIG. 2H). In the current example of the first embodiment of the present invention, "reaction" is "silylation" as in the previous example. Since the insoluble layer 5 is formed along the catalyst film 3, the insoluble layer 5 is formed in a conformal shape in which an uneven surface (the convexities 2b) of the substrate 1 is maintained.

Figure 2I:
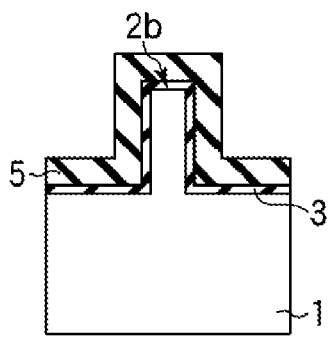

Then, an unreacted portion of the coating film 4 is removed by using the solvent, thereby only the insoluble layer 5 remaining (FIG. 2I).

As such, the insoluble layer 5 may be formed as a conformal film in which an uneven surface (the convexities 2b) of the substrate 1 is maintained.

Figure 3A:
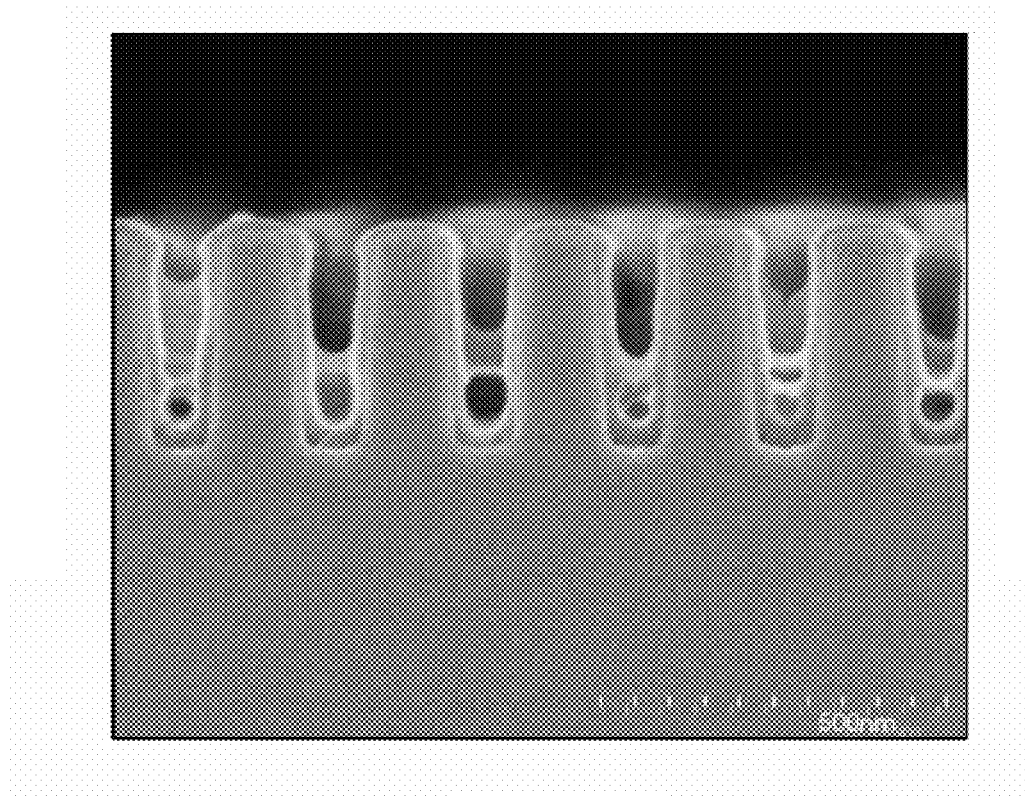
FIG. 3A is a scanning electron microscopic (SEM) image of a pattern formed by using a pattern forming method according to the first embodiment of the present invention.
Figure 3B:
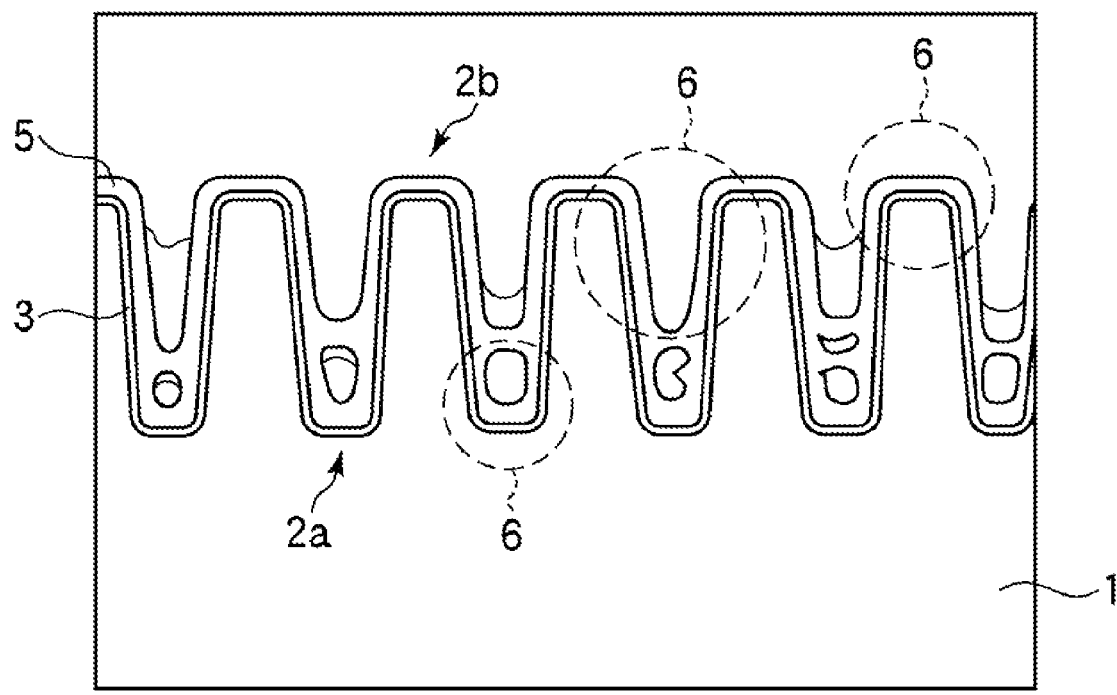
FIG. 3B is a schematic view of the SEM image of FIG. 3A.

FIG. 3A is a scanning electron microscopic (SEM) image of a pattern formed by using a pattern forming method according to the first embodiment of the present invention. FIG. 3B is a schematic view of the SEM image of FIG. 3A.

In FIGS. 3A and 3B, the pattern is formed by making a surface of the substrate 1 uneven by repeatedly forming a concavity 2a and a convexity 2b on the surface of the substrate 1 as a plurality of grooves, and forming a film on the substrate 1 by using the pattern forming method according to the first embodiment of the present invention. The same materials described above with reference to FIGS. 1A through 1I and 2A through 2I are used to form the catalyst film 3 and the coating film 4.

As shown in FIGS. 3A and 3B, although an unreacted portion of the coating film 4 formed by using a coating method is not completely removed from a bottom portion of the concavities 2a, the insoluble layer 5 forms a conformal film in which the uneven surface of the substrate 1 is maintained, for example, as shown with dotted circles 6.

As such, in a pattern forming method according to the first embodiment of the present invention, since the coating film 4 that functions as a base of the insoluble layer 5 to be formed is formed of an SOG, the coating film 4 is formed by using a coating method. Thus, a film (the insoluble layer 5) may be conformally formed with respect to an uneven surface of a substrate with a lower cost and a higher throughput than in a deposition method.

(Second Embodiment)

The second embodiment of the present invention relates to combination examples between and requirements for a catalyst and a fluid material.

FIG. 4 is a table showing combination examples between a catalyst and a fluid material, according to the second embodiment of the present invention.

EXAMPLE 1

Example 1 relates to a case when a basic catalyst is used as the catalyst and an SOG is used as the fluid material, as described above in the first embodiment of the present invention.

In Example 1, soluble and insoluble layers may be formed according to whether the SOG is silylated due to a base, as described above in the first embodiment of the present invention.

A detailed combination of Example 1 is as follows.

(1) An amino-based coupling agent is used as the basic catalyst, and an SOG that can be silylated due to the amino-based coupling agent is used as the SOG.

EXAMPLE 2

Example 2 relates to a case when a basic catalyst is used as the catalyst and a chemical-amplification positive resist is used as the fluid material.

In Example 2, soluble and insoluble layers may be formed according to whether solubility of a positive resist when exposed is inhibited due to a base.

A detailed combination of Example 2 is as follows.

(1) An amino-based coupling agent is used as the basic catalyst, and a positive resist of which solubility is inhibited due to the amino-based coupling agent is used as the positive resist.

EXAMPLE 3

Example 3 relates to a case when a basic catalyst is used as the catalyst and a methyl-silsesquioxane (MSQ)-based spin on dielectric (SOD) is used as the fluid material.

In Example 3, soluble and insoluble layers may be formed since cross-linkage of MSQ varies with a base.

A detailed combination of Example 3 is as follows.

(1) An amino-based coupling agent is used as the basic catalyst, and an MSQ-based SOD of which cross-linkage varies with the amino-based coupling agent is used as the MSQ.

EXAMPLE 4

Example 4 relates to a case when a basic catalyst is used as the catalyst and a melamine resin, a urea resin, an epoxy resin, or a urethane resin is used as the fluid material. An example of the fluid material is industrial plastic.

In Example 4, soluble and insoluble layers may be formed since the resin is condensed and polymerized due to a base.

A detailed combination of Example 4 is as follows.

(1) An amino-based coupling agent is used as the basic catalyst, and a melamine resin, a urea resin, an epoxy resin, or a urethane resin, which is condensed and polymerized due to the amino-based coupling agent, is used as the melamine resin, the urea resin, the epoxy resin, or the urethane resin.

EXAMPLE 5

Example 5 relates to a case when an acid catalyst is used as the catalyst and a chemical-amplification negative resist is used as the fluid material.

In Example 5, soluble and insoluble layers may be formed since a negative resist becomes insoluble due to an acid.

A detailed combination of Example 5 is as follows.

(1) A photoacid generator (PAG) is used as the acid catalyst, and a negative resist that becomes insoluble due to an acid is used as the negative resist.

Particularly in this case, if the negative resist is a typical negative resist, the negative resist contains the PAG. Accordingly, after the catalyst film 3 is formed by using the PAG, an acid is generated by irradiating light having a wavelength for generating an acid, e.g., ultraviolet light, on the catalyst film 3, and a negative resist containing the PAG is coated as the fluid material. Then, for example, while the negative resist containing the PAG is being spin-dried, the generated acid is diffused through the negative resist containing the PAG. As such, when the negative resist containing the PAG is used, the fluid material may become insoluble due to an acid without irradiating light having a wavelength for generating an acid.

Alternatively, the PAG may be used as the acid catalyst, and a resist that does not contain the PAG and becomes insoluble due to an acid may be used as the fluid material. In this case, since the fluid material does not contain the PAG, the fluid material may be prevented from becoming insoluble due to the PAG that can be contained in the fluid material, for example, under ambient light including ultraviolet light.

Also, if the resist that does not contain the PAG is used, after the catalyst film 3 is formed by using the PAG and the coating film 4 is formed by using the resist that does not contain the PAG, an acid may be generated only in the catalyst film 3 by irradiating light having a wavelength for generating an acid, e.g., ultraviolet light on the catalyst film 3 and the coating film 4. In this case, the thickness of the insoluble layer 5 to be formed in the coating film 4 may be controlled by controlling a time for irradiating the light.

EXAMPLE 6

Example 6 relates to a case when a metallic catalyst is used as the catalyst and a material containing a melamine resin is used as the fluid material.

In Example 6, soluble and insoluble layers may be formed since the melamine resin is condensed and polymerized.

A detailed combination of Example 6 is as follows.

(1) Ferric chloride is used as the metallic catalyst, and a material containing a melamine resin that is condensed and polymerized due to the ferric chloride is used as the fluid material.

In the above Examples 1 through 6, when a combination between the catalyst and the fluid material is selected, at least one of the following requirements may be considered.

(Requirement 1)

The catalyst should be hardly dissolved in a solvent of the fluid material.

Requirement 1 is required in order to prevent the catalyst film 3 from being dissolved and lost when the coating film 4 is formed on the catalyst film 3. For this, the following sub-requirements should be met.

(1) A catalyst having an excellent solvent resistance should be selected as the catalyst.

(2) A solvent that can hardly dissolve the catalyst should be selected as the solvent of the fluid material.

(3) Adhesion between the substrate and the catalyst should be improved.

In particular, in order to meet Sub-Requirement (1), the catalyst may be a coupling agent having a functional group that can be bound with a surface of the substrate.

In particular, in order to meet Sub-Requirement (2), the solvent of the fluid material may be "water".

In particular, in order to meet Sub-Requirement (3), an adhesion process such as a silylation process may be performed between the substrate 1 and the catalyst film 3 before forming the coating film 4. For example, if the substrate 1 is a silicon substrate, a catalyst of which adhesion is improved by performing the adhesion process is a PAG.

(Requirement 2)

Although the catalyst film is thin, the catalyst should be sufficiently reacted with the fluid material.

Requirement 2 is required in order to prevent a problem that the concavities 2a are filled with, for example, the catalyst film 3 if the catalyst film 3 is thick, or to prevent cost increase or throughput reduction caused by the formation of the catalyst film 3 thick. For this, the following sub-requirements should be met.

(1) A catalyst having an excellent reactivity to the fluid material should be selected as the catalyst.

(2) A fluid material having an excellent reactivity to the catalyst should be selected as the fluid material.

In particular, in order to meet Sub-Requirement (2), the fluid material may be of a self cross-linking type.

Also, the catalyst film 3 may have a thickness so as not to fill the concavities 2a and to leave space for forming the coating film 4 on the catalyst film 3 formed on the concavities 2a. This thickness is getting smaller as semiconductor devices are miniaturized. Also, if the catalyst film 3 is thick, the semiconductor devices may not be easily miniaturized and thus the catalyst film 3 may have a thickness of about 10 nm or less. Preferably, the catalyst film 3 may have a thickness of about 1 nm or less.

(Requirement 3)

The catalyst film 3 should be conformally formed with respect to an uneven surface of the substrate 1.

Requirement 3 is necessary because the insoluble layer 5 formed in the coating film 4 is formed so as to maintain the shape of the catalyst film 3. For example, if the catalyst film 3 is not conformally formed with respect to the uneven surface of the substrate 1 and is slantingly formed to be thick at a bottom portion of the concavities 2a and to be thin at a top portion of the concavities 2a, the insoluble layer 5 cannot maintain the shape of the concavities 2a of the substrate 1 and is slantingly formed with respect to the concavities 2a of the substrate 1 as the catalyst film 3 that is slantingly formed. Requirement 3 is required in order to prevent this problem. For this, the following sub-requirement should be met.

(1) The catalyst film 3 should be formed to have a thickness as small as possible so as to be close to a monomolecular film.

In particular, in order to meet Sub-Requirement (1), the catalyst may have a coupling site with the substrate 1. Such catalyst may be a coupling agent or a silylation agent.

Also, the catalyst film 3 may be formed by using a deposition method or a gas absorption method.

(Requirement 4)

An unreacted portion of the coating film 4 should be easily removed.

Requirement 4 is required in order to prevent a problem that an ultimate film cannot maintain the shape of the uneven surface of the substrate 1 if the unreacted portion of the coating film 4 is not removed. For this, the following sub-requirements should be met.

(1) The fluid material should not be self-reacting without the catalyst.

(2) A solvent for easily resolving the unreacted portion of the coating film 4 should be used.

(Third Embodiment)

A pattern may be formed by using the pattern forming method described above with reference to the first embodiment of the present invention. A method of forming a pattern by using a pattern forming method according to the first embodiment of the present invention, and a method of manufacturing a semiconductor device by using the pattern forming method will now be described as the third embodiment of the present invention.

Figure 5:
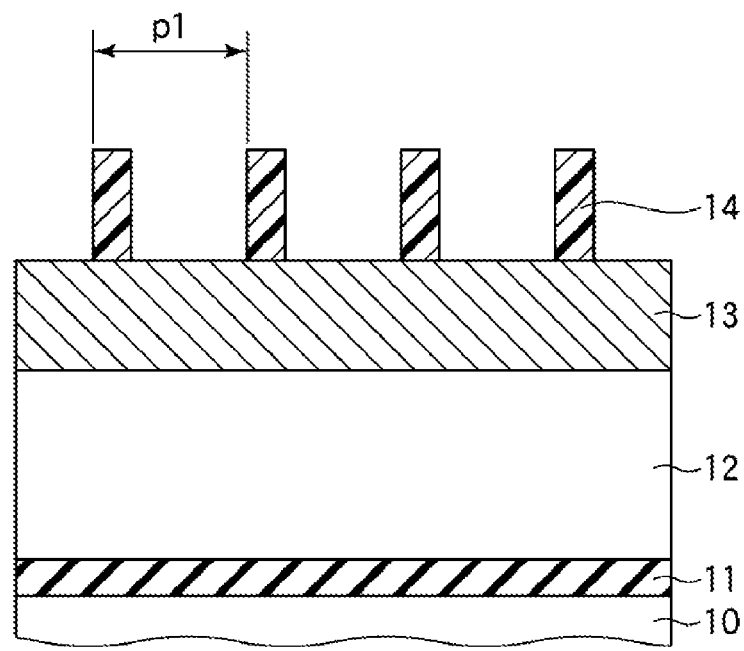
FIGS. 5 through 13 are cross-sectional views for describing a method of manufacturing a semiconductor device, according to a third embodiment of the present invention.

Initially, as shown in FIG. 5, an etching stopper 11 is formed on an internal structure 10 of the semiconductor device, such as a silicon substrate or an interlayer insulating film. A base layer 12 formed of a different material from that of the etching stopper 11 is formed on the etching stopper 11. The etching stopper 11 may be a silicon nitride film. The base layer 12 may be an interlayer insulating film such as a silicon oxide film containing carbon. Then, a sacrificial film 13 formed of a different material from that of the base layer 12 is formed on the base layer 12. The sacrificial film 13 may be a polysilicon film. Then, a resist pattern 14 having an interval of p1 is formed on the sacrificial film 13.

Figure 6:
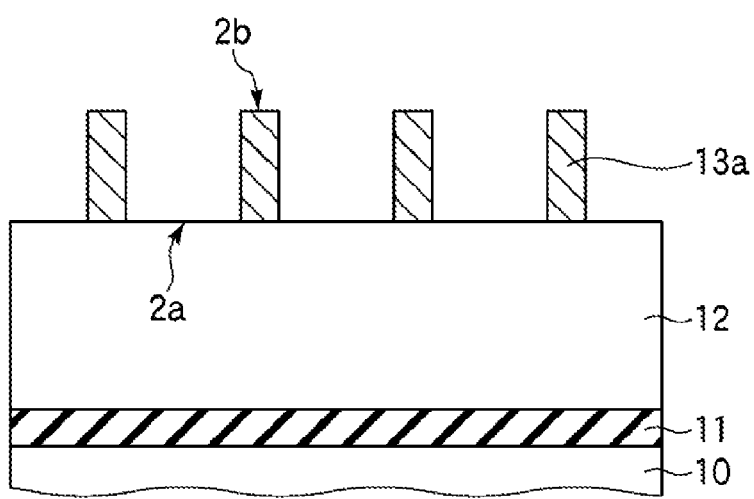

Then, as shown in FIG. 6, the sacrificial film 13 is etched by using the resist pattern 14 as a mask so as to form a convex sacrificial film pattern 13a that corresponds to the resist pattern 14. Then, the resist pattern 14 is removed by ashing the resist pattern 14. Each groove of the convex sacrificial film pattern 13a corresponds to the concavities 2a illustrated in FIGS. 1A through 1I and each piece of the convex sacrificial film pattern 13a corresponds to the convexities 2b illustrated in FIGS. 2A through 2I. Thus, the structure illustrated in FIG. 6 is identical to the structure of the substrate 1 illustrated in FIGS. 1A through 1I or FIGS. 2A through 2I.

Figure 7:
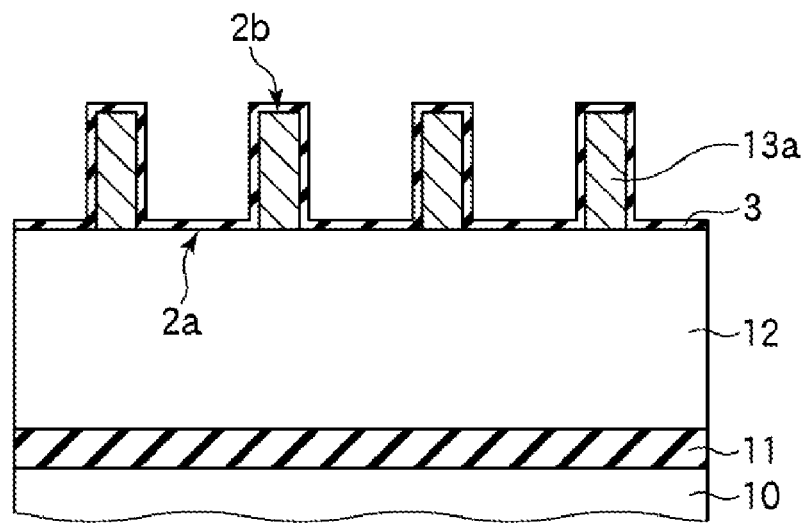

Then, as shown in FIG. 7, on the base layer 12 and the convex sacrificial film pattern 13a, a catalyst film 3 is formed along an uneven surface of the substrate 1, which is formed due to the base layer 12 and the convex sacrificial film pattern 13a. As described above with reference to the first embodiment of the present invention, the catalyst film 3 may be formed of an amino-based coupling agent (amino-based silylation agent). The amino-based coupling agent may be attached on the base layer 12 and the convex sacrificial film pattern 13a to be conformal with respect to the uneven surface of the substrate 1, which is formed due to the base layer 12 and the convex sacrificial film pattern 13a by using a coating method, and more particularly, a spin-coating method.

Figure 8:
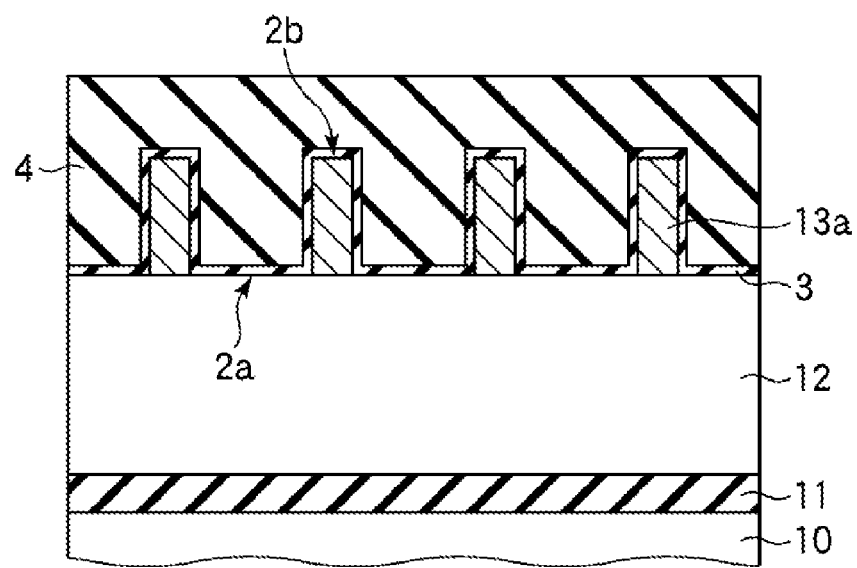

Then, as shown in FIG. 8, a coating film 4 is formed by coating a fluid material on the catalyst film 3. As described above with reference to the first embodiment of the present invention, the fluid material may be an SOG in which silanol condensation occurs due to the amino-based coupling agent and may be coated on the catalyst film 3 by using a spin-coating method.

Figure 9:
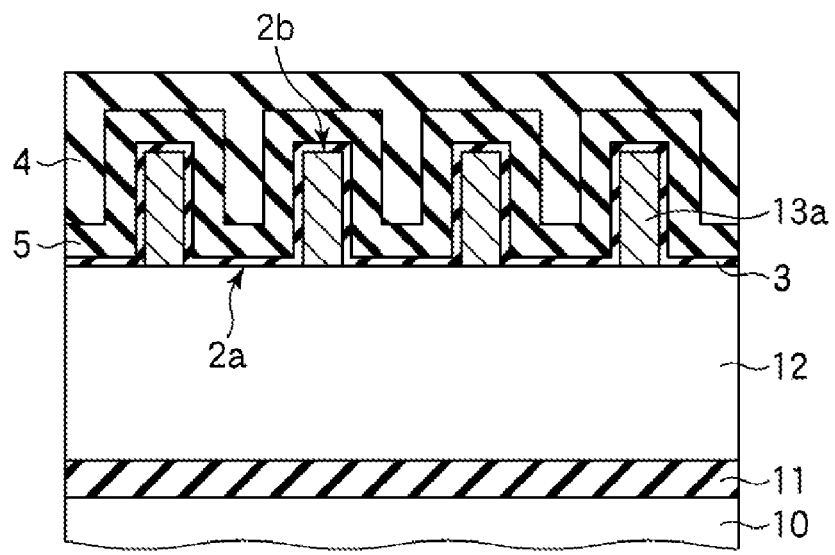

Then, as shown in FIG. 9, an insoluble layer 5 that is insoluble in a solvent is formed in the coating film 4 by reacting the coating film 4 along the catalyst film 3. In the current embodiment of the present invention, "reaction" is "silylation" and a silylated portion of the coating film 4 becomes the insoluble layer 5 that is insoluble in the solvent. The solvent may be a material which does not dissolve the silylated portion of the coating film 4 and dissolves an unreacted portion that is not silylated, such as IPA. Since the insoluble layer 5 is formed along the catalyst film 3, the insoluble layer 5 is formed in a conformal shape in which the shapes of the concavities 2a and the convexities 2b are maintained. Also, this reaction occurs while the coated fluid material is spin-dried.

Figure 10:
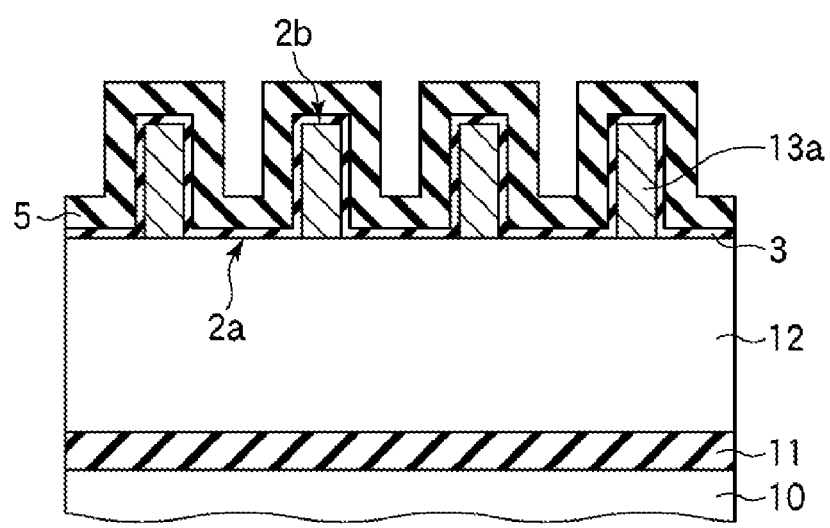

Then, as shown in FIG. 10, the unreacted portion of the coating film 4 is removed by using the solvent, thereby only the insoluble layer 5 remaining. As such, the insoluble layer 5 may be formed as a conformal film in which the shapes of the concavities 2a and the convexities 2b are maintained. The coating film 4 that functions as a base of the insoluble layer 5 is formed of the SOG and is formed by using a coating method using a fluid material. Thus, according to the current embodiment of the present invention, the insoluble layer 5 may be formed with a low cost and a high throughput.

Figure 11:
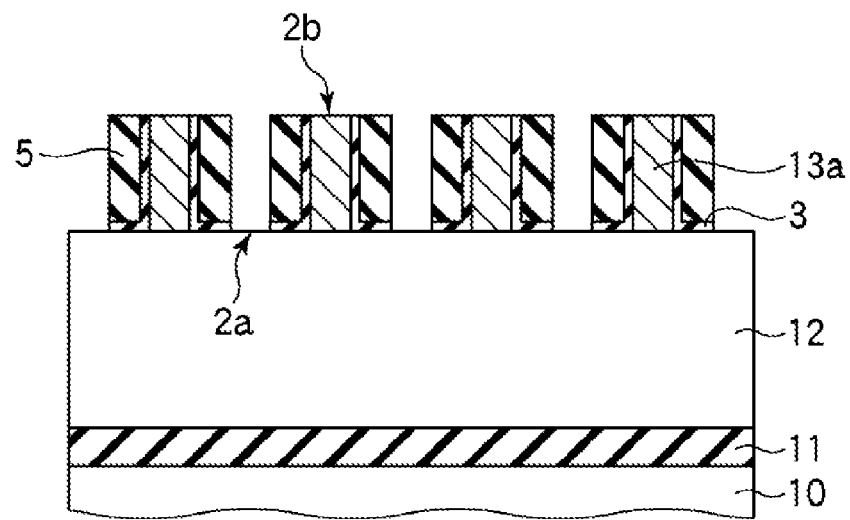

Then, as shown in FIG. 11, a top portion of the convex sacrificial film pattern 13a is exposed from a top portion of the insoluble layer 5 and a bottom portion of the insoluble layer 5 in grooves of the convex sacrificial film pattern 13a is removed by etching the insoluble layer 5.

Figure 12:
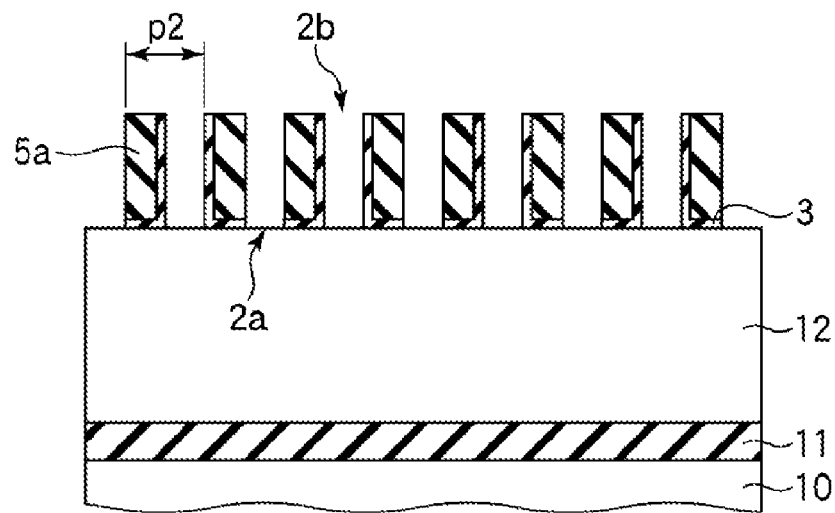

Then, as shown in FIG. 12, the convex sacrificial film pattern 13a is removed form the exposed top portion of the convex sacrificial film pattern 13a, thereby only the insoluble layer 5 remaining Thus, a convex pattern 5a is formed by using the insoluble layer 5 that is formed according to the first embodiment of the present invention. An interval p2 of the convex pattern 5a may be about a half of the interval p1 of the resist pattern 14 and thus the convex pattern 5a may be finely formed.

Figure 13:
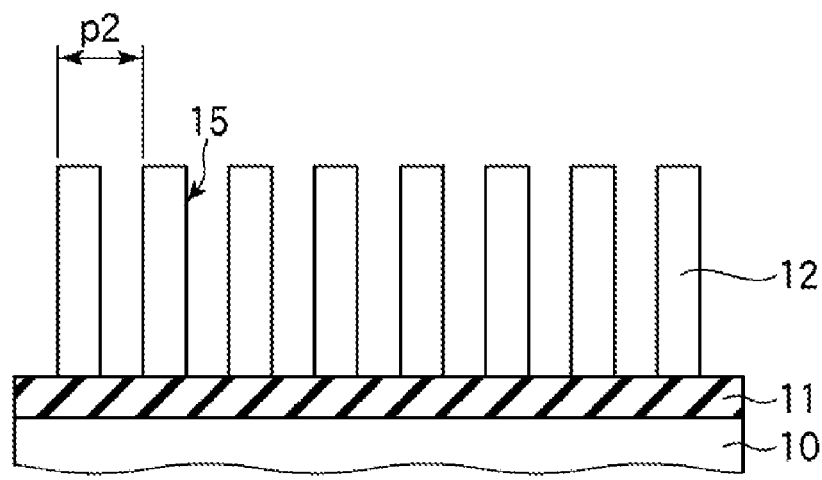

Also, as shown in FIG. 13, the base layer 12 may be processed into predetermined patterns by etching the base layer 12 by using the convex pattern 5a as a mask. According to the current embodiment of the present invention, the base layer 12 may be processed into a repeated line and space (L/S) pattern 15 having the interval of p2.

Also, a spin process including a spin-coating process and a spin-drying process is generally performed in order to coat and dry the fluid material. However, the spin process can lead to formation of a wind mark on the coating film 4. An example of the coating film on which the wind mark is formed is illustrated in FIG. 14.

Figure 14:
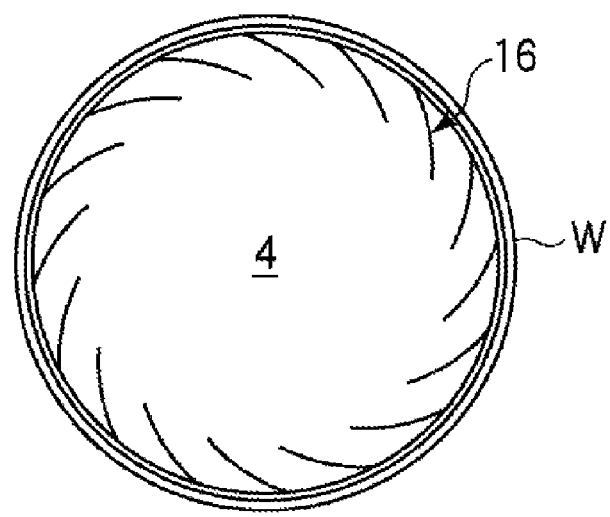
FIG. 14 is a plan view of a semiconductor wafer on which a coating film is formed.
Figure 15A:
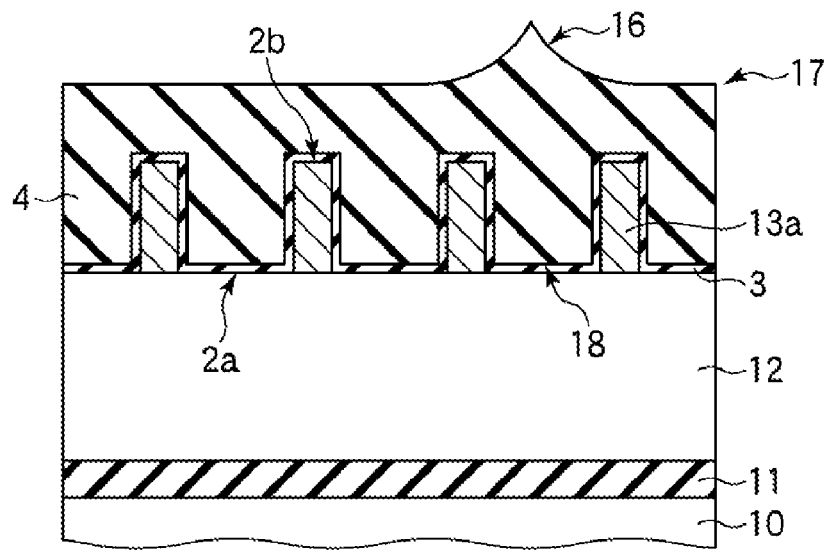
FIGS. 15A and 15B are cross-sectional views of a coating film on which a wind mark is formed.
Figure 15B:
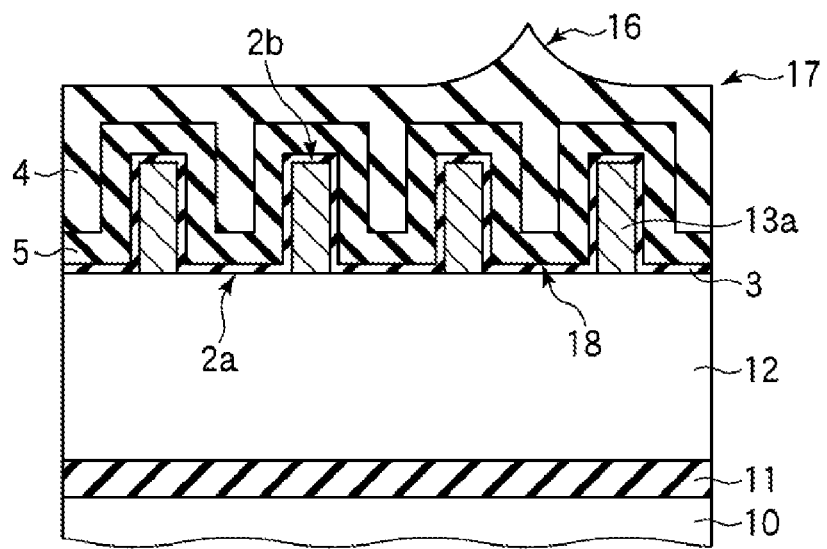

FIG. 14 is a plan view of a semiconductor wafer W on which the coating film 4 is formed. As shown in FIG. 14, if the number of revolutions in a spin process is large, the wind mark 16 is formed on a surface of the coating film 4 near the periphery of the semiconductor wafer W. FIGS. 15A and 15B are cross-sectional views of the coating film 4 on which the wind mark 16 is formed.

As shown in FIG. 15A, if the wind mark 16 is formed on the coating film 4, the thickness of the coating film 4 varies on the wind mark 16, which is not recommendable for a semiconductor device. For example, if the coating film 4 is a photoresist, an exposure process may be unevenly performed due to variations in thickness of the coating film 4.

Currently, the wind mark 16 is inhibited by reducing the number of revolutions in a spin process.

However, a diameter of a substrate, e.g., the semiconductor wafer W such as a silicon wafer, is getting larger from 300 mm to 450 mm and from 450 mm to a larger diameter. As the diameter of the semiconductor wafer W is getting larger, the number of revolutions for controlling the wind mark 16 should be further reduced. For example, in the case of the semiconductor wafer W having a diameter of 300 mm, the number of revolutions may be inhibited to be below 1000 revolutions per minute (rpm). However, in the case of the semiconductor wafer W having a diameter of 450 mm, the number of revolutions should be further inhibited to be, for example, below 800 rpm. As the number of revolutions is reduced, more time is required to coat and dry the coating film 4. Accordingly, if a diameter of a wafer is larger, the throughput is lower.

However, according to the third embodiment of the present invention, as shown in FIG. 15B, a reaction occurs from an interface 18 between the catalyst film 3 and the coating film 4, instead of a surface 17 of the coating film 4. This reaction also occurs in the first embodiment of the present invention. If the reaction of the coating film 4 occurs from the interface 18 between the catalyst film 3 and the coating film 4, although the wind mark 16 is formed on the surface 17 of the coating film 4, a serious problem does not occur. As such, although the semiconductor wafer W has a large diameter, the number of revolutions may be maintained at a high level in the spin process. For example, in the case of the semiconductor wafer W having a diameter of 300 mm, the number of revolutions may be increased to be, for example, above 1000 rpm, and in the case of the semiconductor wafer W having a diameter of 450 mm, the number of revolutions may be increased to be, for example, above 800 rpm.

As such, according to the third embodiment of the present invention, the number of revolutions may be maintained at a high level in a spin process and thus throughput reduction caused by a large diameter of a semiconductor wafer may be inhibited. Due to the above advantage, the method according to the third embodiment of the present invention is useful to manufacture a semiconductor device including a semiconductor wafer of which diameter is getting larger.

(Fourth Embodiment)

FIGS. 16A through 16E and 17A through 17D are cross-sectional views for describing a pattern forming method according to an example of a fourth embodiment of the present invention.

As shown in FIGS. 16A through 16E and 17A through 17D, a difference from the example illustrated in FIGS. 1A through 1I is that the catalyst film 3 and the coating film 4 illustrated in FIGS. 1A through 1I are repeatedly formed. The current example of the fourth embodiment of the present invention will now be described in detail.

Figure 16A:
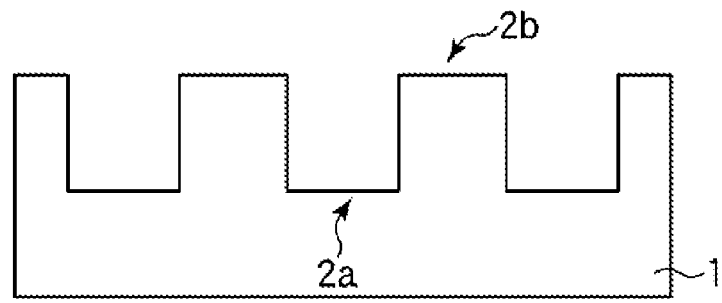
FIGS. 16A through 16E and 17A through 17D are cross-sectional views for describing a pattern forming method according to an example of a fourth embodiment of the present invention.

Initially, as shown in FIG. 16A, a substrate 1 having concavities 2a is prepared. In the current example of the fourth embodiment of the present invention, the substrate 1 has an L/S pattern in which the concavities 2a and convexities 2b are alternately repeated at about 1:1 distances.

Figure 16B:
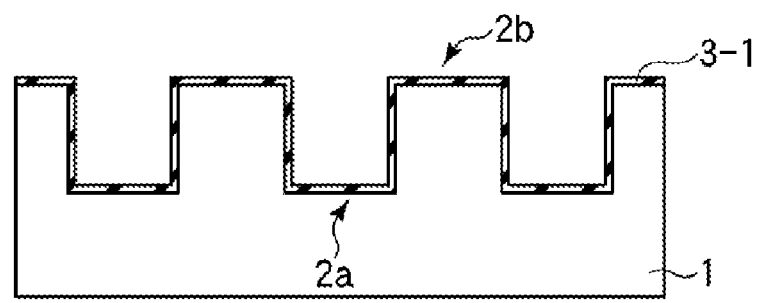

Then, as shown in FIG. 16B, a first catalyst film 3-1 is formed on the substrate 1. The first catalyst film 3-1 is formed of an amino-based coupling agent on the market as in the first embodiment of the present invention. In the current example, KBM603 by Shin-Etsu Chemical Co., Ltd. (Japan) is used as the amino-based coupling agent. Also, the amino-based coupling agent is diluted with a solvent and pure water is used as the solvent. As such, the amino-based coupling agent that is diluted with pure water is coated, for example, spin-coated on the substrate 1, thereby forming the first catalyst film 3-1 on the substrate 1. After that, a thermal process is performed on the substrate 1 on which the first catalyst film 3-1 is formed so as to vaporize the solvent. For example, the thermal process may be performed at about 100 to 150° C. for about 60 to 90 seconds. The substrate 1 is cooled after the thermal process is completed.

Figure 16C:
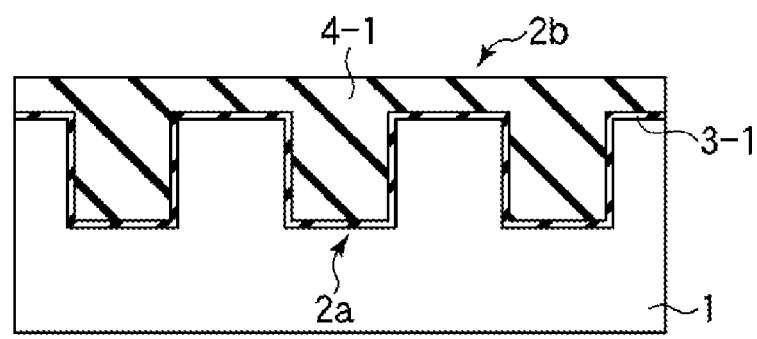

Then, as shown in FIG. 16C, a first coating film 4-1 is formed by coating a fluid material on the first catalyst film 3-1. The first coating film 4-1 is formed of an SOG on the market as in the first embodiment of the present invention. In the current example, OCDT-12 by Tokyo Ohka Kogyo Co., Ltd. is used as the SOG. The SOG is coated, for example, spin-coated on the substrate 1, thereby forming the first coating film 4-1 on the first catalyst film 3-1.

Figure 16D:
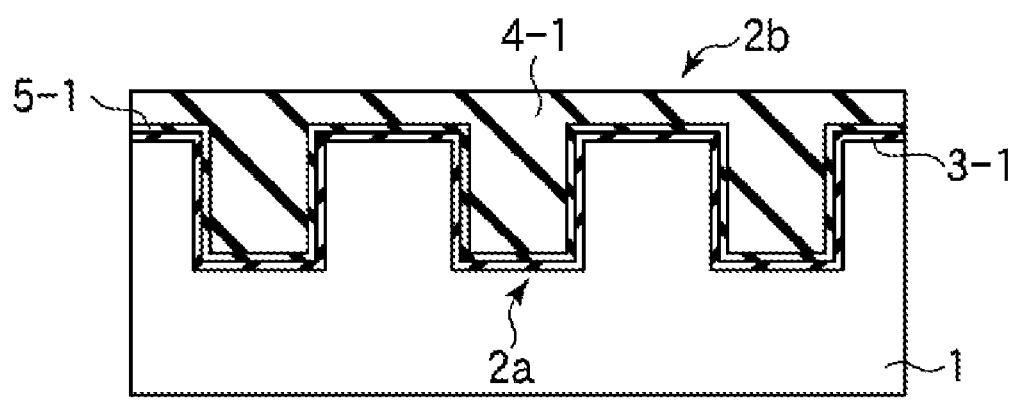

Then, as shown in FIG. 16D, the first coating film 4-1 is spin-dried. A reaction occurs in the first coating film 4-1 along the first catalyst film 3-1 while the first coating film 4-1 is spin-coated and then is spin-dried or while the first coating film 4-1 is spin-dried, thereby forming a first insoluble layer 5-1. Also, in the current example of the fourth embodiment of the present invention, an unreacted portion of the first coating film 4-1 is rinsed away by using a rinsing solution such as IPA while the first coating film 4-1 is spin-dried. If the unreacted portion of the first coating film 4-1 is rinsed away while the first coating film 4-1 is spin-dried, the unreacted portion of the first coating film 4-1 may be entirely or partially removed before the first coating film 4-1 formed of the SOG is dried and becomes insoluble. Thus, the first coating film 4-1 that is dried and becomes insoluble may not remain in the concavities 2a.

Figure 16E:
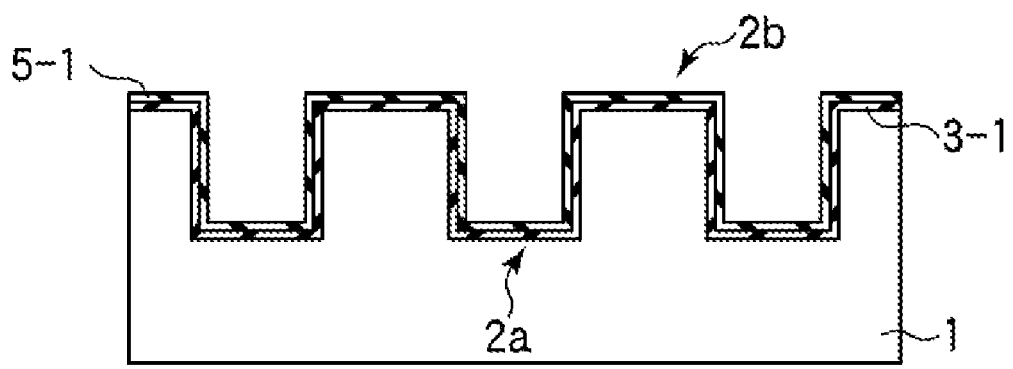
Figure 17A:
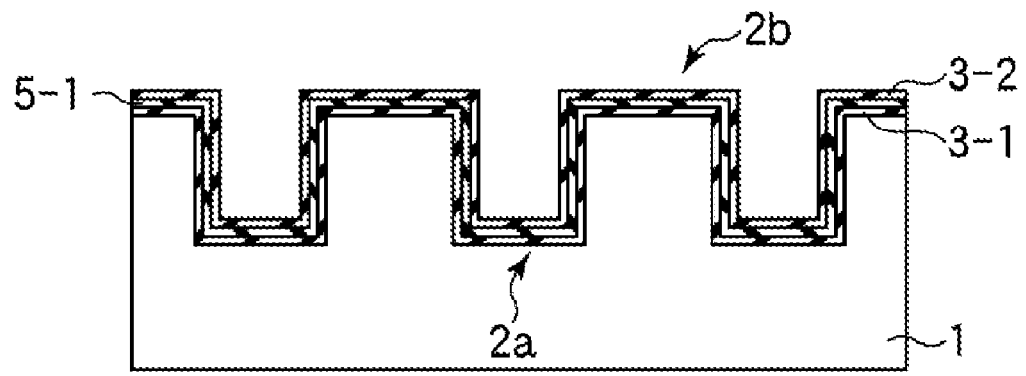
Figure 17B:
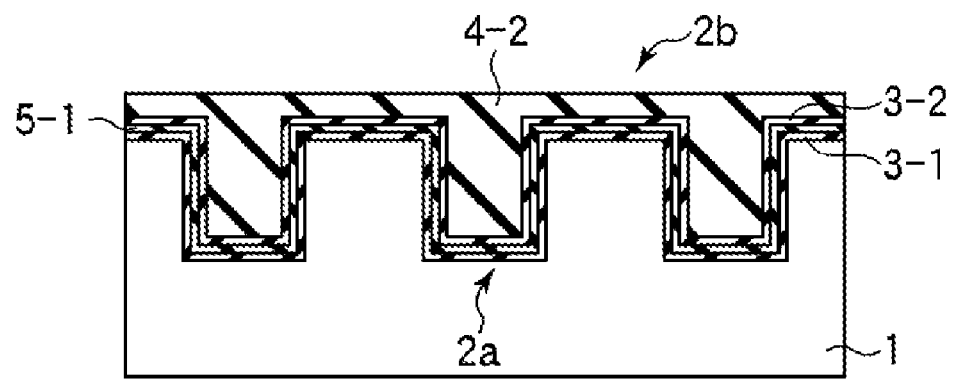
Figure 17C:
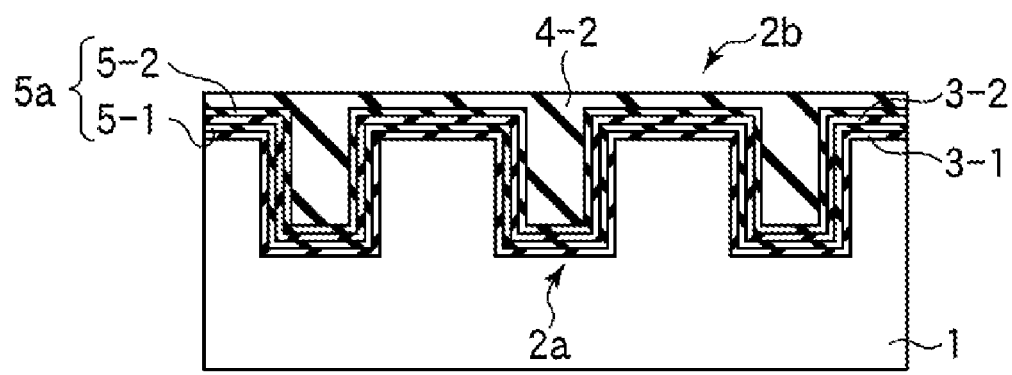
Figure 17D:
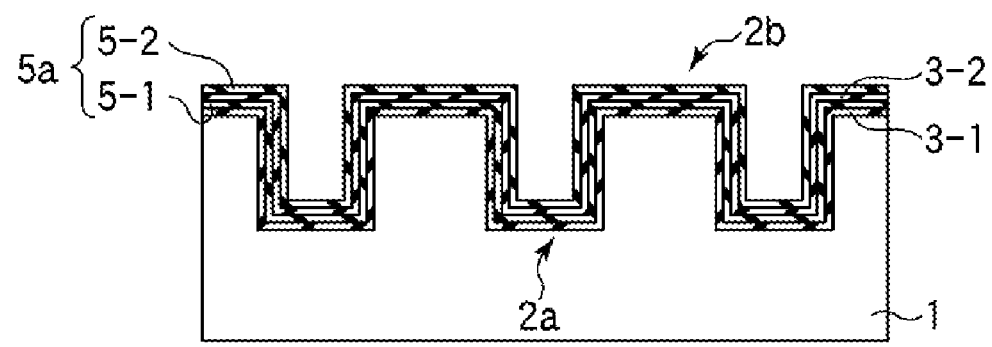

Then, as shown in FIG. 16E, after the first coating film 4-1 is rinsed, a thermal process is performed on the substrate 1 so as to vaporize a solvent in the first coating film 4-1, or the rinsing solution for rinsing the first coating film 4-1. For example, the thermal process may be performed at about 100 to 150° C. for about 60 to 90 seconds. The substrate 1 is cooled after the thermal process is completed. Thus, the first insoluble layer 5-1 is formed.

Then, as shown in FIGS. 17A through 17D, a second catalyst film 3-2 and a second coating film 4-2 are formed on the first insoluble layer 5-1 by repeating the processes described above with reference to FIGS. 16B through 16E. Materials, forming conditions, process orders, and processing conditions for, e.g., thermal processes of the second catalyst film 3-2 and the second coating film 4-2, may be the same as those of the first catalyst film 3-1 and the first coating film 4-1. As such, a second insoluble layer 5-2 is formed along the second catalyst film 3-2, thereby forming a multi-layer insoluble layer 5a including a plurality of insoluble layers such as the first and second insoluble layers 5-1 and 5-2.

Accordingly, the insoluble layer 5 described above in the first through third embodiments of the present invention may be formed as the multi-layer insoluble layer 5a including a plurality of insoluble layers.

Figure 18A:
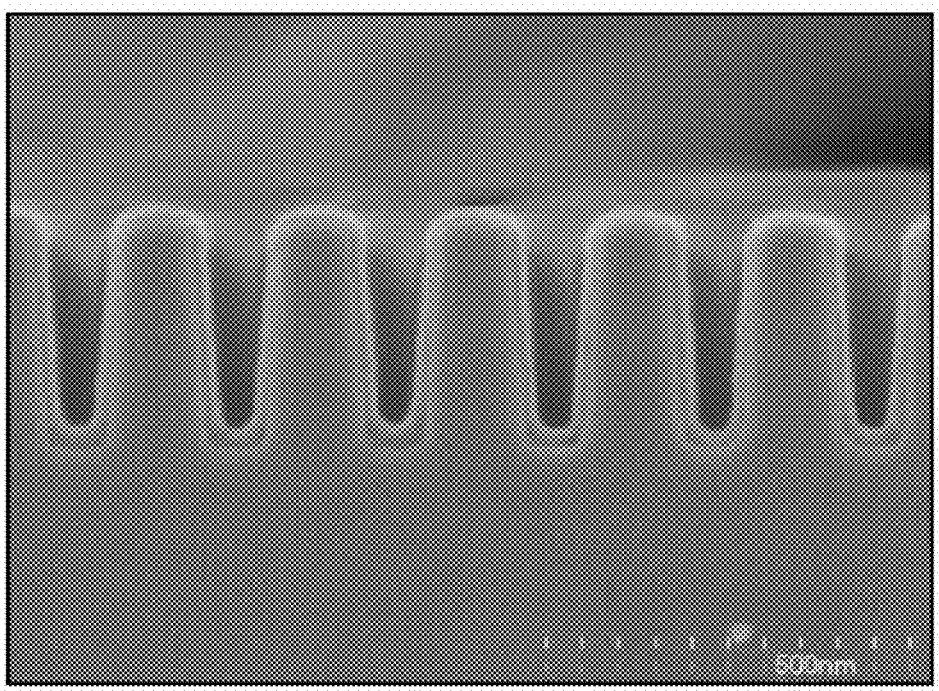
FIG. 18A is a SEM image of a pattern formed by using the pattern forming method according to the example of the fourth embodiment of the present invention.
Figure 18B:
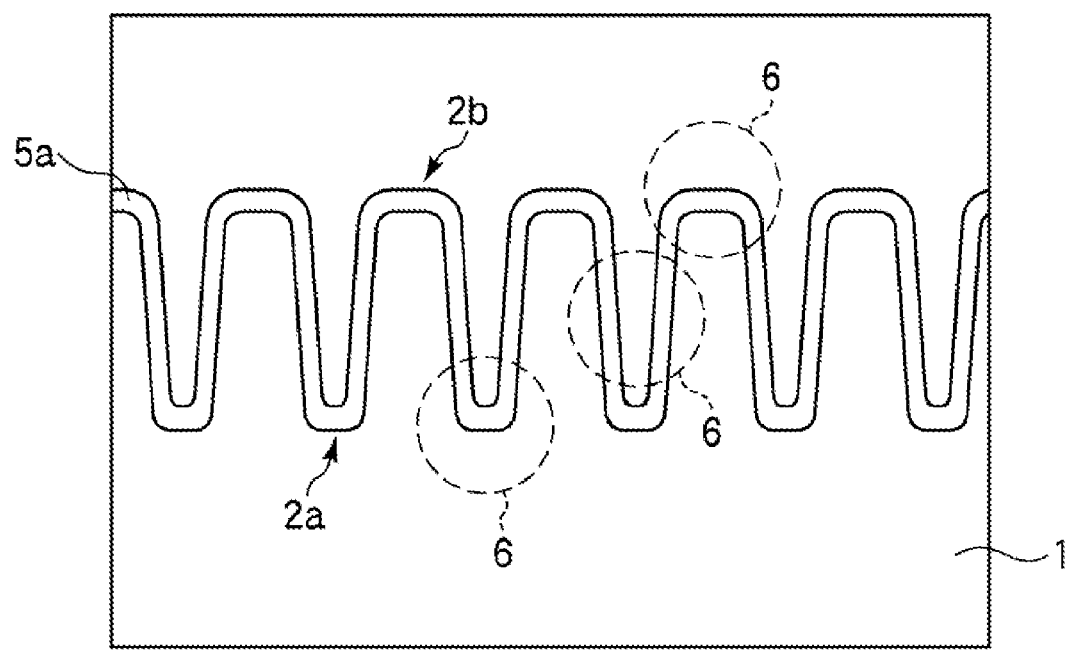
FIG. 18B is a schematic view of the SEM image of FIG. 18A.

FIG. 18A is a SEM image of a pattern formed by using the pattern forming method according to the example of the fourth embodiment of the present invention. FIG. 18B is a schematic view of the SEM image of FIG. 18A.

As shown in FIGS. 18A and 18B, the multi-layer insoluble layer 5a is also formed in a conformal shape in which an uneven surface of the substrate 1 is maintained on a bottom portion of the concavities 2a, and on side and top portions of the convexities 2b, for example, as shown with dotted circles 6.

Also, in FIGS. 18A and 18B, the multi-layer insoluble layer 5a is formed by repeating the processes described above with reference to FIGS. 16B through 16E five times, and thus includes five insoluble layers.

The multi-layer insoluble layer 5a may be an L/S pattern in which the concavities 2a and the convexities 2b are alternately repeated. Alternatively, the multi-layer insoluble layer 5a may be a single pattern in which, for example, a single convexity 2b is formed. The single pattern of the multi-layer insoluble layer 5a will now be described in detail as another example of the fourth embodiment of the present invention.

FIGS. 19A through 19E and 20A through 20D are cross-sectional views for describing a pattern forming method according to another example of the fourth embodiment of the present invention.

Figure 19A:
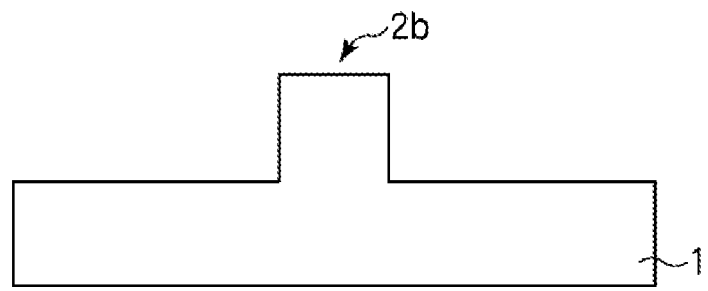
FIGS. 19A through 19E and 20A through 20D are cross-sectional views for describing a pattern forming method according to another example of the fourth embodiment of the present invention.
Figure 19B:
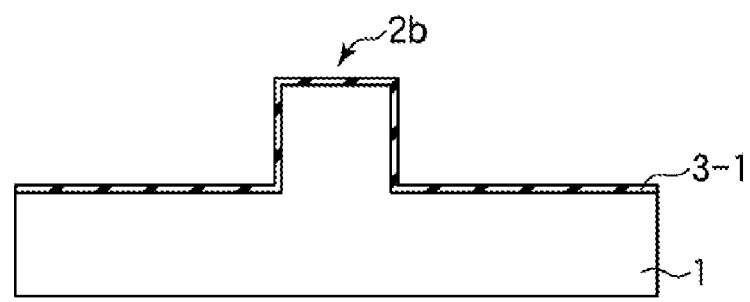
Figure 19C:
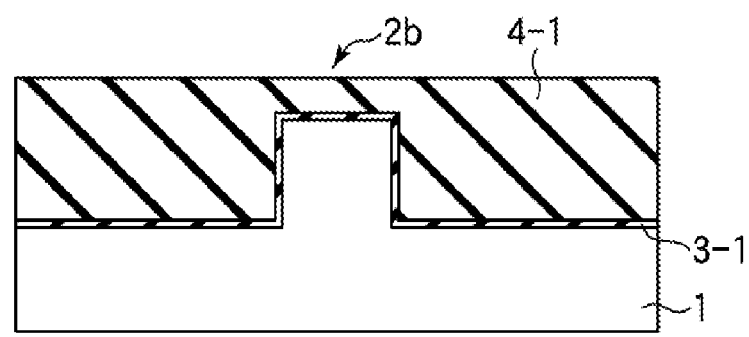
Figure 19D:
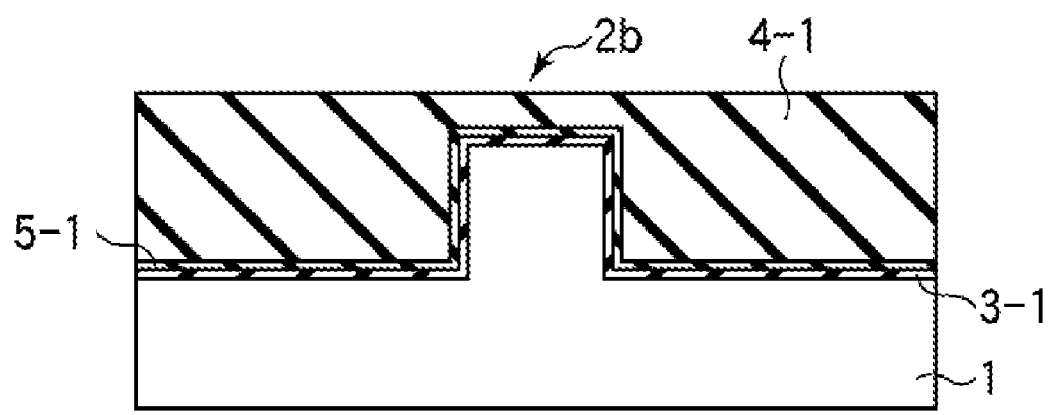
Figure 19E:
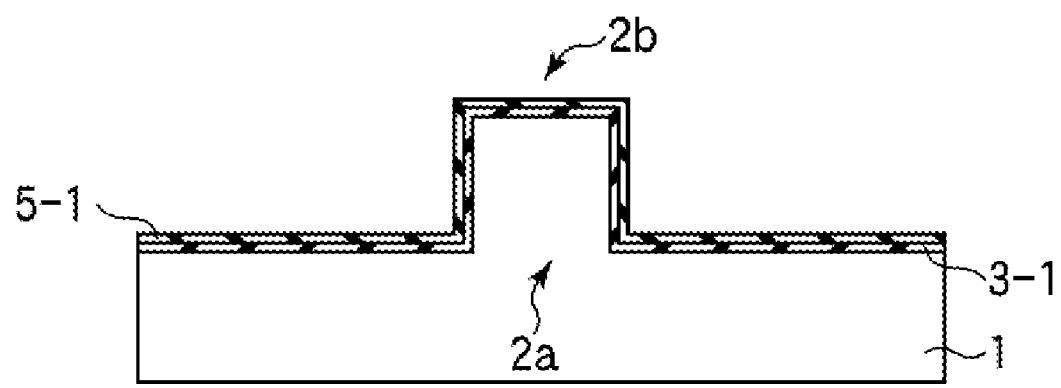
Figure 20A:
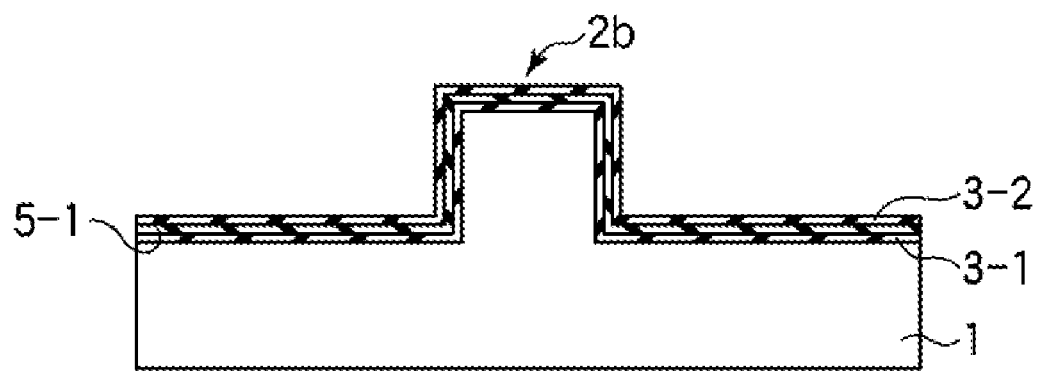
Figure 20B:
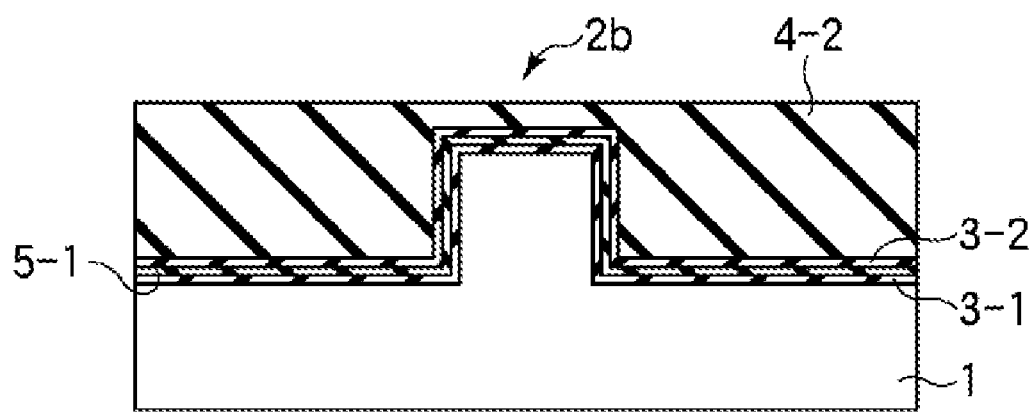
Figure 20C:
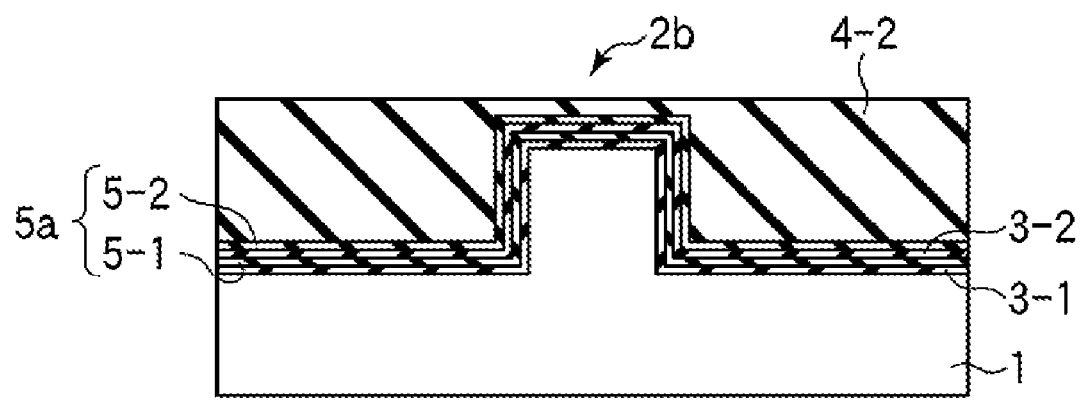
Figure 20D:
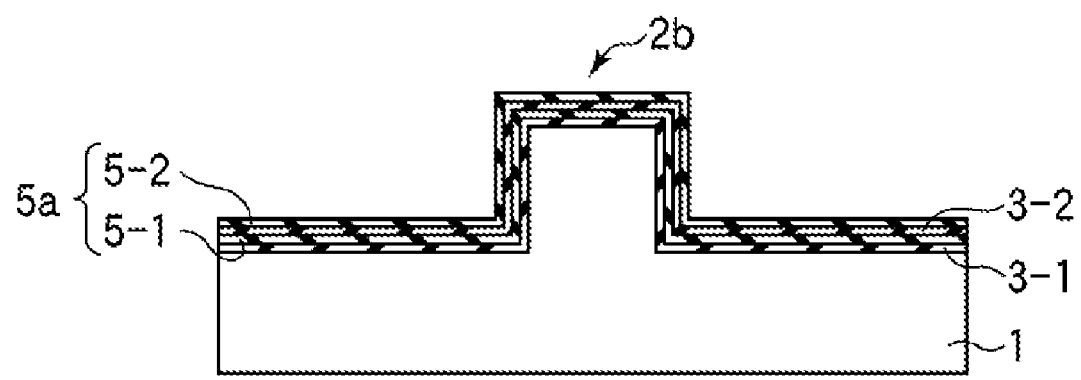

Initially, as shown in FIG. 19A, a substrate 1 having a single convexity 2b is prepared.

Then, as shown in FIGS. 19B through 19E, a first catalyst film 3-1 and a first coating film 4-1 are formed on the substrate 1 and then a first insoluble layer 5-1 is formed by reacting the first coating film 4-1 along the first catalyst film 3-1, by performing the processes described above with reference to FIGS. 16B through 16E. Materials, forming conditions, process orders, and processing conditions for, e.g., thermal processes of the first catalyst film 3-1 and the first coating film 4-1, may be the same as those of the first catalyst film 3-1 and the first coating film 4-1 illustrated in FIGS. 16B through 16E.

Also, as shown in FIGS. 20A through 20D, a second catalyst film 3-2 and a second coating film 4-2 are formed on the first insoluble layer 5-1 by repeating the processes described above with reference to FIGS. 19B through 19E. Materials, forming conditions, process orders, and processing conditions for, e.g., thermal processes of the second catalyst film 3-2 and the second coating film 4-2, may be the same as those of the first catalyst film 3-1 and the first coating film 4-1.

Figure 21A:
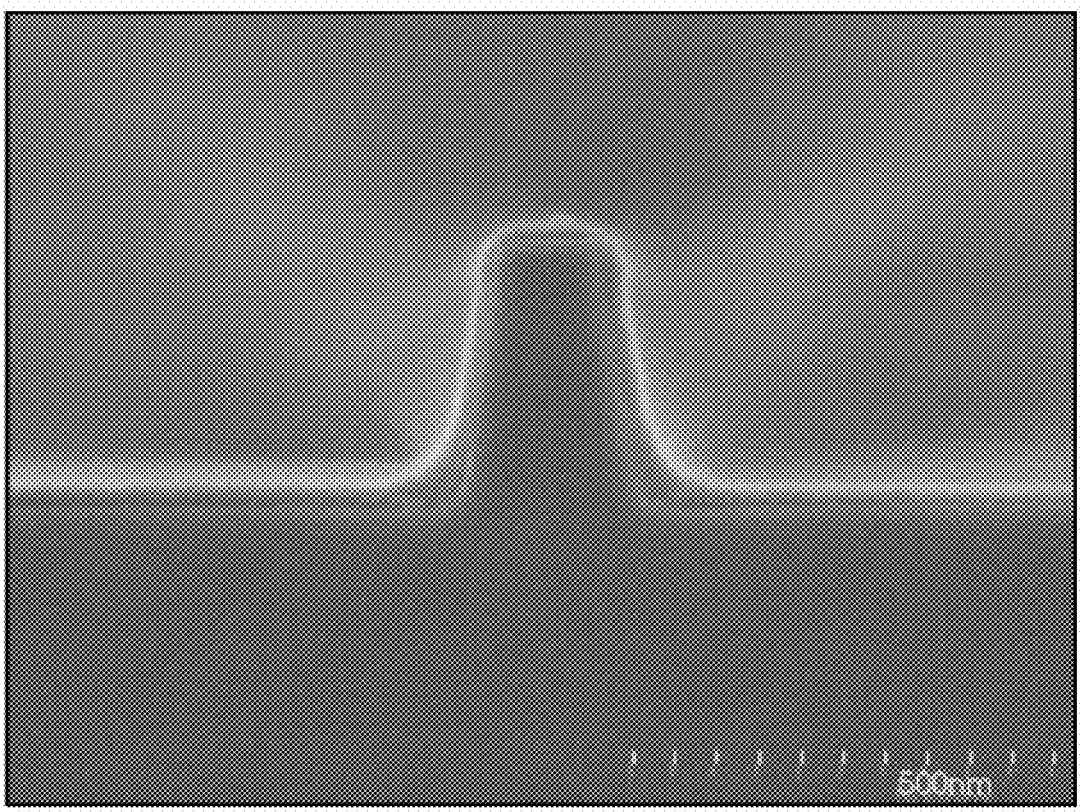
FIG. 21A is a SEM image of a pattern formed by using the pattern forming method according to the other example of the fourth embodiment of the present invention.
Figure 21B:
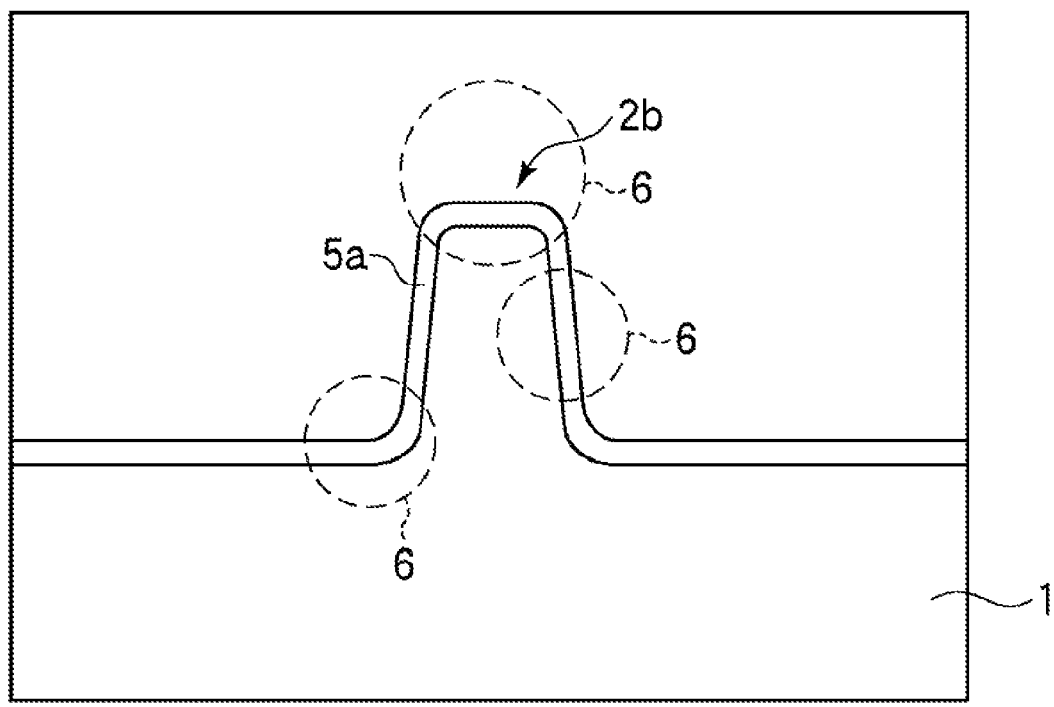
FIG. 21B is a schematic view of the SEM image of FIG. 21A.

FIG. 21A is a SEM image of a pattern formed by using the pattern forming method according to the other example of the fourth embodiment of the present invention. FIG. 21B is a schematic view of the SEM image of FIG. 21A.

As shown in FIGS. 21A and 21B, although the substrate 1 has the single convexity 2b, a multi-layer insoluble layer 5a is also formed in a conformal shape in which an uneven surface of the substrate 1 is maintained on bottom, side, and top portions of the single convexity 2b, for example, as shown with dotted circles 6.

Also, in FIGS. 21A and 21B, the multi-layer insoluble layer 5a is formed by repeating the processes described above with reference to FIGS. 19B through 19E five times, and thus includes five insoluble layers.

As such, in a pattern forming method according to the fourth embodiment of the present invention, each of a plurality of coating films that function as a base of the multi-layer insoluble layer 5a to be formed is formed by using a coating method. Thus, a film (the multi-layer insoluble layer 5a) may be conformally formed with respect to an uneven surface of a substrate with a lower cost and a higher throughput than in a deposition method.

As described above, according to the present invention, a pattern forming method of forming a conformal film in which an uneven surface of a substrate is maintained with a lower cost and with a higher throughput than in a deposition method, and a method of manufacturing a semiconductor device by using the pattern forming method may be provided.

While the present invention has been particularly shown and described with reference to exemplary embodiments thereof, it will be understood by those of ordinary skill in the art that various changes in form and details may be made therein.

For example, although an L/S pattern on an interlayer insulating film is described as an example of a method of manufacturing a semiconductor device, in the third embodiment of the present invention, the present invention is not limited to the L/S pattern on the interlayer insulating film. For example, the present invention may also be used to pattern a so-called hard mask that functions as a mask when a base layer is etched.

Also, in addition to an etching process, the present invention may be applied to form a conformal film in which an uneven surface of a base should be maintained.

What is claimed is:

1. A pattern forming method comprising:
   forming a catalyst film on a base layer having an uneven surface, wherein the catalyst film is formed along the uneven surface of the base layer;
   improving adhesion between the base layer and the catalyst film;
   forming a coating film by coating a fluid material on the catalyst film;
   forming an insoluble layer in the coating film by reacting the coating film along the catalyst film, wherein the insoluble layer is insoluble in a solvent; and
   maintaining the insoluble layer by removing an unreacted portion of the coating film by using the solvent.

2. The pattern forming method of claim 1, wherein a catalyst of the catalyst film is a basic catalyst.

3. The pattern forming method of claim 2, wherein the basic catalyst is an amino-based coupling agent, and
   wherein the fluid material is a spin on glass (SOG) that is silylated due to the amino-based coupling agent, a positive resist of which solubility is inhibited due to the amino-based coupling agent, or a methyl-silsesquioxane (MSQ)-based spin on dielectric (SOD) of which cross-linkage varies with the amino-based coupling agent.

4. The pattern forming method of claim 2, wherein the basic catalyst is an amino-based coupling agent, and
   wherein the fluid material is a melamine resin, a urea resin, an epoxy resin, or a urethane resin, which is condensed and polymerized due to the amino-based coupling agent.

5. The pattern forming method of claim 1, wherein a catalyst of the catalyst film is an acid catalyst.

6. The pattern forming method of claim 5, wherein the acid catalyst is a photoacid generator (PAG), and
   wherein the fluid material is a negative resist which becomes insoluble due to an acid.

7. The pattern forming method of claim 5, wherein the acid catalyst is a PAG, and
   wherein the fluid material is a resist which becomes insoluble due to an acid and does not contain the PAG.

8. The pattern forming method of claim 1, wherein a catalyst of the catalyst film is a metallic catalyst.

9. The pattern forming method of claim 8, wherein the metallic catalyst is ferric chloride, and
   wherein the fluid material is a melamine resin that is condensed and polymerized due to the ferric chloride.

10. The pattern forming method of claim 1, wherein a catalyst that is hardly dissolved in a solvent of the fluid material is selected as a catalyst of the catalyst film.

11. The pattern forming method of claim 1, wherein a solvent that hardly dissolves a catalyst of the catalyst film is selected as a solvent of the fluid material.

12. The pattern forming method of claim 1, wherein the catalyst film has a thickness of 10 nm or less.

13. The pattern forming method of claim 1, wherein the catalyst film has a thickness of 1 nm or less.

14. The pattern forming method of claim 1, wherein the catalyst film is conformally formed with respect to the uneven surface of the base layer.

15. The pattern forming method of claim 14, wherein a catalyst of the catalyst film has a binding site with the base layer.

16. The pattern forming method of claim 14, wherein the catalyst film is formed by using a deposition method or a gas absorption method.

17. The pattern forming method of claim 1, wherein the fluid material does not self-react without a catalyst of the catalyst film.

18. A method of forming a pattern, the method comprising:
   forming an insoluble layer conforming to a sacrificial film pattern, which forms an uneven surface on a base layer, by using the pattern forming method of claim 1;
   exposing a top portion of the sacrificial film pattern by etching the insoluble layer; and
   maintaining the insoluble layer while removing the exposed top portion of the sacrificial film pattern.

19. A method of manufacturing a semiconductor device, the method comprising:
   forming an insoluble layer conforming to a sacrificial film pattern, which forms an uneven surface on a base layer, by using the pattern forming method of claim 1;
   exposing a top portion of the sacrificial film pattern by etching the insoluble layer;
   maintaining the insoluble layer while removing the exposed top portion of the sacrificial film pattern; and
   etching the base layer by using the insoluble layer as a mask to form the base layer into a predetermined pattern.

* * * * *